(12) United States Patent
Kinsman

(10) Patent No.: US 6,798,063 B2
(45) Date of Patent: Sep. 28, 2004

(54) LOW PROFILE BALL GRID ARRAY PACKAGE

(75) Inventor: Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/940,791

(22) Filed: Aug. 29, 2001

(65) Prior Publication Data

US 2002/0024123 A1 Feb. 28, 2002

Related U.S. Application Data

(62) Division of application No. 09/632,087, filed on Aug. 2, 2000, which is a division of application No. 09/028,646, filed on Feb. 24, 1998, now Pat. No. 6,172,419.

(51) Int. Cl.⁷ .............................................. H01L 23/48
(52) U.S. Cl. .................. 257/737; 257/701; 257/778
(58) Field of Search .................................. 257/707, 706

(56) References Cited

U.S. PATENT DOCUMENTS

| | | |
|---|---|---|
| 5,474,958 A | 12/1995 | Djennas et al. |
| 5,541,450 A | 7/1996 | Jones et al. |
| 5,620,928 A | 4/1997 | Lee et al. |
| 5,639,695 A | 6/1997 | Jones et al. |
| 5,696,666 A | 12/1997 | Miles et al. |
| 5,717,252 A * | 2/1998 | Nakashima et al. ........ 257/707 |
| 5,773,884 A | 6/1998 | Andros et al. |
| 5,966,803 A | 10/1999 | Wilson |
| 5,982,033 A | 11/1999 | Ohsawa et al. |
| 6,020,218 A | 2/2000 | Shim et al. |
| 6,158,116 A * | 12/2000 | Ishikawa et al. .............. 29/832 |
| 6,266,242 B1 * | 7/2001 | Maruyama et al. ......... 361/687 |

FOREIGN PATENT DOCUMENTS

| | | |
|---|---|---|
| DE | 196 50 296 A | 10/1997 |
| EP | 0 231 937 A | 8/1987 |
| JP | 041196563 A | 4/1992 |
| WO | WO 97 15076 A | 4/1997 |

* cited by examiner

*Primary Examiner*—Amir Zarabian
*Assistant Examiner*—Kiesha Rose
(74) *Attorney, Agent, or Firm*—Dickstein Shapiro Morin & Oshinsky LLP

(57) ABSTRACT

The present invention is a method and apparatus for a very low profile ball grid array package. A substrate is provided with an aperture. A thin sheet material is secured to the substrate, covering the aperture, so as to form a cavity. A semiconductor die is mounted in the formed cavity on the thin sheet material. The semiconductor die is encapsulated with the thin sheet material supporting it during encapsulation. The use of the thin sheet material to form the cavity is a cost effective way to construct a ball grid array package having a very low profile.

7 Claims, 4 Drawing Sheets

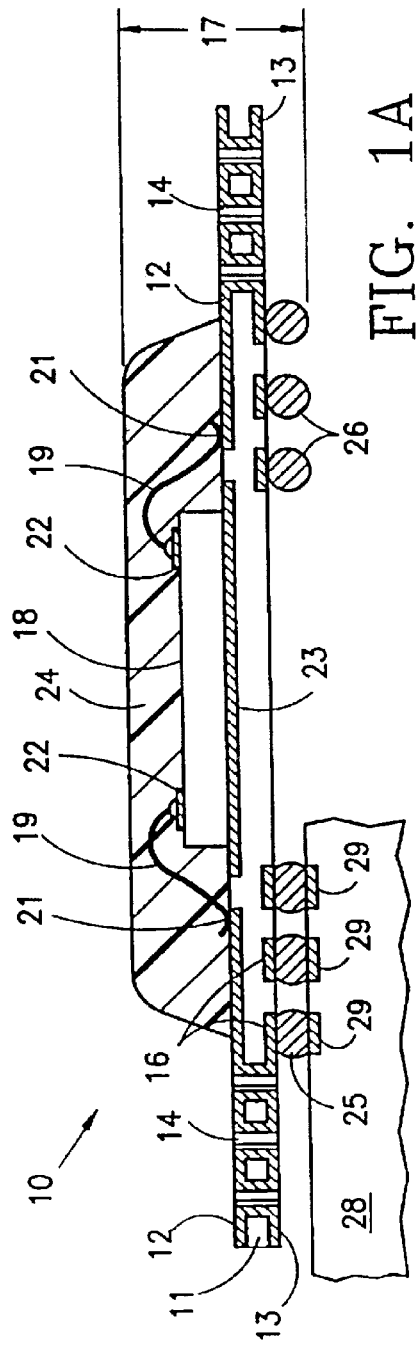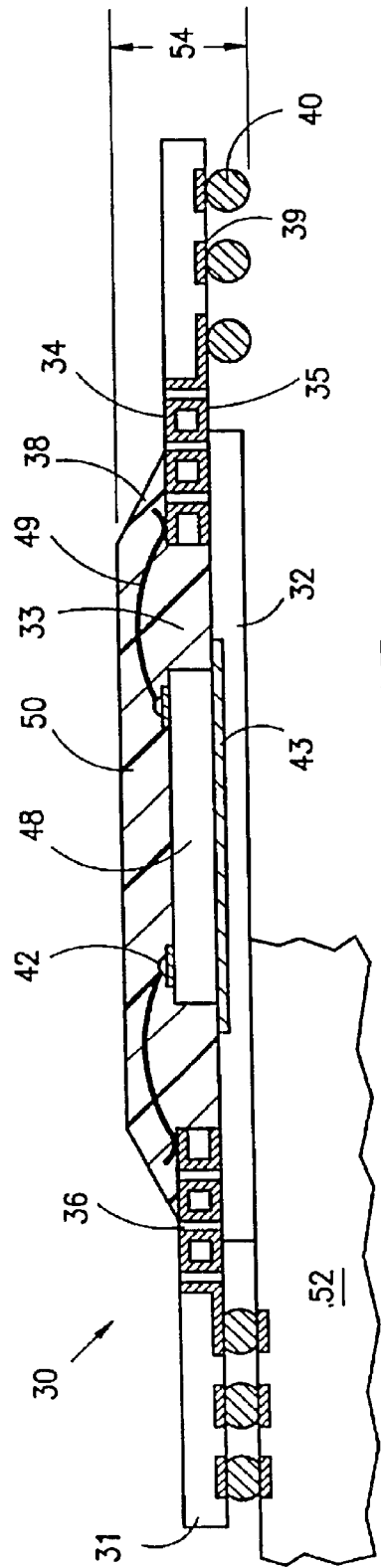
FIG. 1A
PRIOR ART
FIG. 1B
PRIOR ART

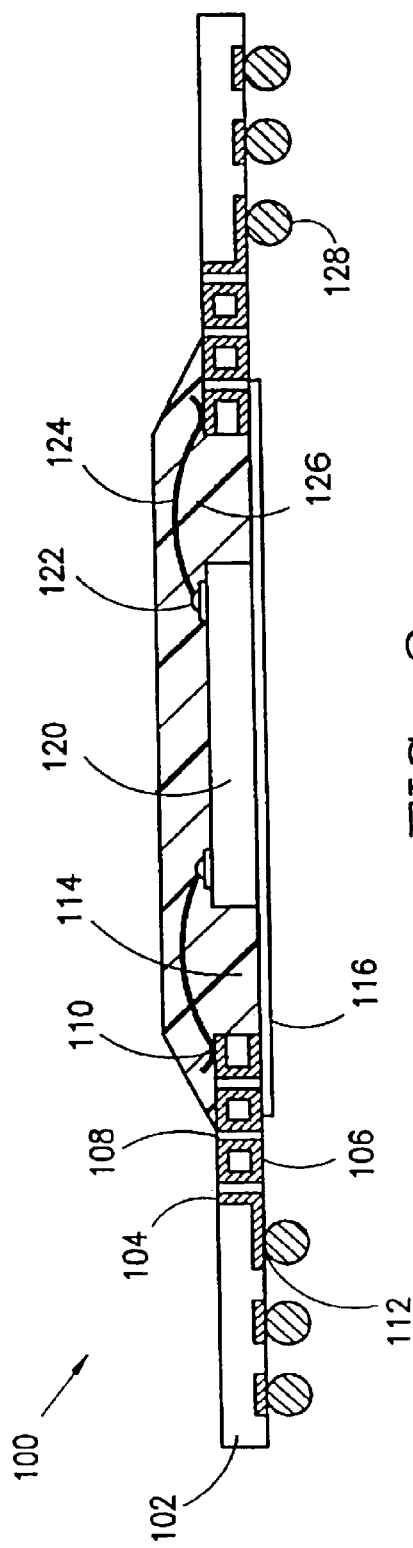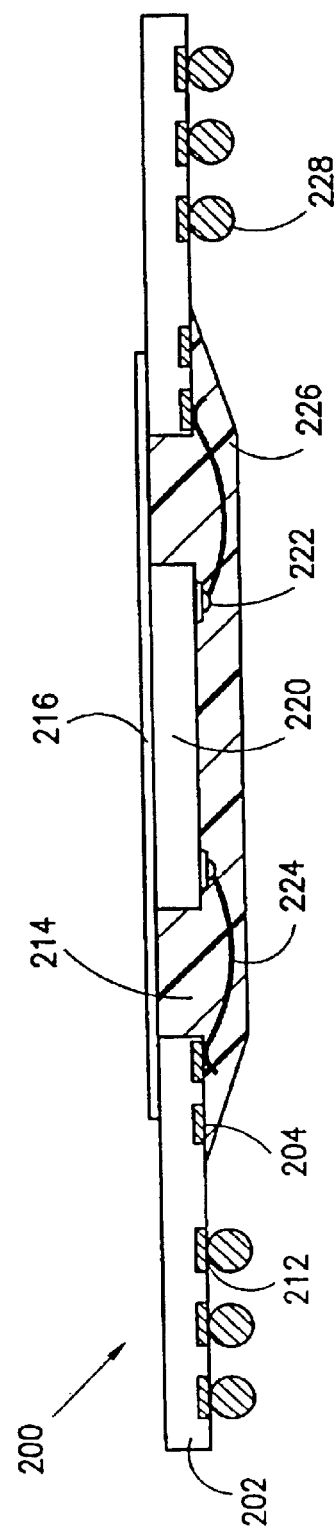

LOW PROFILE BALL GRID ARRAY PACKAGE

This application is a divisional application of U.S. patent application Ser. No. 09/632,087 filed Aug. 2, 2000, which is a divisional application of U.S. patent application Ser. No. 09/028,646 filed Feb. 24, 1998, U.S. Pat. No. 6,172,419, the entirety of which are incorporated herein by reference.

FIELD OF THE INVENTION

The present invention relates to a semiconductor package and more particularly to a low cost cavity type ball grid array (BGA) semiconductor package with a very low profile and to a method for its fabrication.

BACKGROUND OF THE INVENTION

Semiconductor devices are widely used in various types of electronic products, consumer products, printed circuit cards, and the like. In an integrated circuit, a number of active semiconductor devices are formed on a chip of silicon and interconnected in place by leads to form a complete circuit. The size and cost of the semiconductor devices are important features in many of these applications. Any reduction in the cost of producing the package or reduction in the size or thickness of the package can provide a significant commercial advantage.

Ball grid array semiconductor packages are well known in the electronics industry. Currently available prior types include the Plastic Ball Grid Array (PBGA), the Ceramic Ball Grid Array (CBGA), and the Tape Ball Grid Array (TBGA). A BGA package typically comprises a substrate, such as a printed circuit board, with a series of metal traces on the top side. This series of metal traces is connected to a second series of metal traces on the bottom side of the substrate through a series of wire channels located around the periphery of the substrate. A semiconductor die, having a plurality of bond pads, each associated with an input or output of the semiconductor die, is mounted to the top side of the substrate. The bond pads are connected to the series of metal traces on the top side of the substrate by wire bonds. Typically, the semiconductor die and wire bonds are encapsulated with a molding compound. The second series of metal traces located on the bottom side of the substrate each terminate with a contact pad where a conductive solder ball is attached. The conductive solder balls are arranged in an array pattern, and are connected to the next level assembly or a printed wiring board in the final application.

Alternatively, the substrate may be provided with a series of metal traces on only the bottom side, and the semiconductor die is attached to the bottom of the substrate. The bond pads of the semiconductor die are attached to the series of metal traces on the bottom side of the substrate. The series of metal traces located on the bottom side of the substrate terminate with a contact pad where a conductive solder ball is attached. The conductive solder balls are arranged in an array pattern, and are connected to the next level assembly or a printed wiring board in the final application.

FIG. 1A illustrates a cross-sectional view of a typical prior art perimeter BGA integrated circuit package 10. BGA package 10 comprises a substrate 11 having top conductive traces 12 formed on an upper surface of substrate 11. Substrate 11 typically is formed from an organic epoxy-glass resin based material, such as bismaleimide-triazin (BT) resin or FR-4 board. The thickness of substrate 11 is generally on the order of 0.35 mm. Bottom conductive traces 13 are formed on a lower surface of substrate 11 and are electrically connected to top conductive traces 12 through vias or plated through-holes 14. Vias 14 extend from the upper surface of substrate 11 to the lower surface. Vias 14 contain a conductive material such as copper. Top conductive traces 12 terminate with bond posts or pads 21. Bottom conductive traces 13 terminate with ball or terminal pads 16. Top conductive traces 12, bottom conductive traces 13, ball pads 16, and bond posts 21 comprise an electrically conductive material such as copper or copper plated with gold. Not all top conductive traces 12, bottom conductive traces 13, and vias 14 are shown to avoid overcrowding of the drawing.

BGA package 10 further comprises a semiconductor element or semiconductor die 18 attached to a die attach pad 23 on the upper surface of substrate 11. Semiconductor die 18 is attached to die attach pad 23 using an epoxy. Semiconductor die 18 has a plurality of bonding or bond pads 22 formed on an upper surface. Each of the plurality of bond pads 22 is electrically connected to top conductive traces 12 with a wire bond 19. Typically, semiconductor die 18, wire bonds 19, and a portion of substrate 11 are covered by an encapsulating enclosure 24, such as an epoxy enclosure.

Conductive solder balls 26 are each attached to a ball pad 16. Conductive solder balls 26 are metallurgically wetted to ball pads 16 during a reflow process. The inner-most conductive solder balls 26 are typically underneath or adjacent to semiconductor die 18. Conductive solder balls 26 are later connected to a next level of assembly or printed circuit board 28 using a standard reflow process. Conductive solder balls 26 connect to contact pads 29 to form solder joints 25. After the mounting process, solder joints 25 take a flattened spherical shape defined by solder volume and wetting areas. The number and arrangement of conductive solder balls 26 on the lower surface of substrate 11 depends on circuit requirements including input/output (I/O), power and ground connections.

FIG. 1B illustrates a cross-sectional view of another typical prior art perimeter BGA integrated circuit package 30. BGA package 30 comprises a substrate 31 and a support or base substrate 32 attached to substrate 31. Substrate 31 and support substrate 32 typically are formed from an organic epoxy-glass resin based material, such as bismaleimide-triazin (BT) resin or FR-4 board. The thickness of substrate 31 and support substrate 32 is generally on the order of 0.35 mm each. Substrate 31 has an opening or aperture 33, which forms a cavity with support substrate 32 as the lower cavity surface. The dimensions (length and width) of support substrate 32 are greater than the dimensions of opening 33 and less than the dimensions of substrate 31. Substrate 31 has top conductive traces 34 formed on the upper surface, and bottom conductive traces 35 formed on the lower surface electrically connected to top conductive traces 34 through vias or plated through holes 36. Top conductive traces 34 terminate at one end with a bond post or pad 38. Bottom conductive traces 35 terminate with a conductive ball pad or contact 39. A plurality of conductive solder balls or contacts 40 are each coupled to a conductive ball pad 39.

BGA package 30 also contains a semiconductor element or semiconductor die 48 attached to a die attach pad 43 on the upper surface of support substrate 32. Support substrate 32 and opening 33 provide a cavity for semiconductor die 48, which minimizes the effect of die thickness on the overall package height. Bond pads 42 are electrically connected to top conductive traces 34 with a wire bond 49. Typically, semiconductor die 48, wire bonds 49 and a portion of substrate 31 are covered by an encapsulating enclosure 50, such as an epoxy enclosure. Conductive solder balls 40 are later connected to a next level of assembly or a printed circuit board 52 using a standard reflow process.

BGA packages 10, 30 have several disadvantages, including a high profile. Height 17 of BGA package 10 is typically on the order of 2.4 mm, while height 54 of BGA package 30 is typically on the order of 0.9 to 1.46 mm. It is often desirable to minimize the thickness of a packaged semiconductor device since they are widely used in various types of electronic products, portable consumer products, telephones, pagers, automobiles, integrated circuit cards, and the like, in order to make the final products as thin as possible. Thus, there exists a need in the electronics industry for a BGA package that has a very low profile.

Another disadvantage of BGA packages 10, 30 is the cost of production. The use of substantial amounts of substrate in the manufacturing of BGA packages increases the overall cost of production. Thus, there exists a need in the electronics industry for a BGA package that is cost effective.

The present invention has been designed to address the needs of the electronics industry and to overcome some of the limitations associated with a low cost, low profile BGA package.

SUMMARY OF THE INVENTION

The present invention advantageously provides a low cost semiconductor device having a very low profile on the order of approximately 0.7 mm, and a method for making the same.

In one embodiment, a single or multi-layered substrate, having conductive traces on at least the top and bottom sides, is provided with an opening. A layer of very thin material, such as polyimide or metal foil based tape, is secured on the bottom side of the substrate to cover the opening in the substrate. A semiconductor die is inserted into the cavity formed by the opening in the substrate and the tape. The semiconductor die has a plurality of input/output terminals on its top surface, which are electrically connected to the conductive traces on the top of the substrate by bonding wires. The top conductive traces of the laminate are connected to the bottom conductive traces of the substrate by vias. Contacts or solder balls are connected to the bottom conductive traces of the substrate for connection to a next level of assembly or a printed wiring board. The semiconductor die, bond wires and part of the substrate are typically encapsulated with an encapsulating material.

In a second embodiment, a single or multi-layered substrate having conductive traces on at least the bottom side is provided with an opening. A layer of very thin material, such as polyimide or metal foil based tape, is secured to the top side of the substrate to cover the opening. A semiconductor die is mounted upside down in the downward facing cavity formed by the opening in the substrate and tape. The semiconductor die has a plurality of input/output terminals on its top surface, which is now facing downward, which are electrically connected to the conductive traces on the bottom of the substrate by wire bonds. Contacts or solder balls are connected to the bottom conductive traces of the substrate for connection to a next level of assembly or a printed wiring board. The semiconductor die; bond wires and part of the substrate are typically encapsulated with an encapsulating material.

Thus, in one aspect the invention provides a semiconductor device which has a very low profile on the order of 0.7 mm.

In yet another aspect the invention provides a semiconductor device with a very low profile which can be manufactured at a very low cost.

In yet another aspect the invention provides a method for manufacturing a low cost, very low profile semiconductor device.

The above and other objects, advantages, and features of the invention will become more readily apparent from the following detailed description of the invention which is provided in connection with the accompanying drawings.

BRIEF DESCRIPTION OF THE DRAWINGS

FIGS. 1A and 1B illustrate diagrammatic cross-sectional views of prior art perimeter BGA packages;

FIG. 2 illustrates a diagrammatic cross-sectional view of a ball grid array package according to the present invention;

FIG. 3 illustrates a diagrammatic cross-sectional view of an alternate ball grid array package according to the present invention;

DETAILED DESCRIPTION OF PREFERRED EMBODIMENTS

Figure 4:
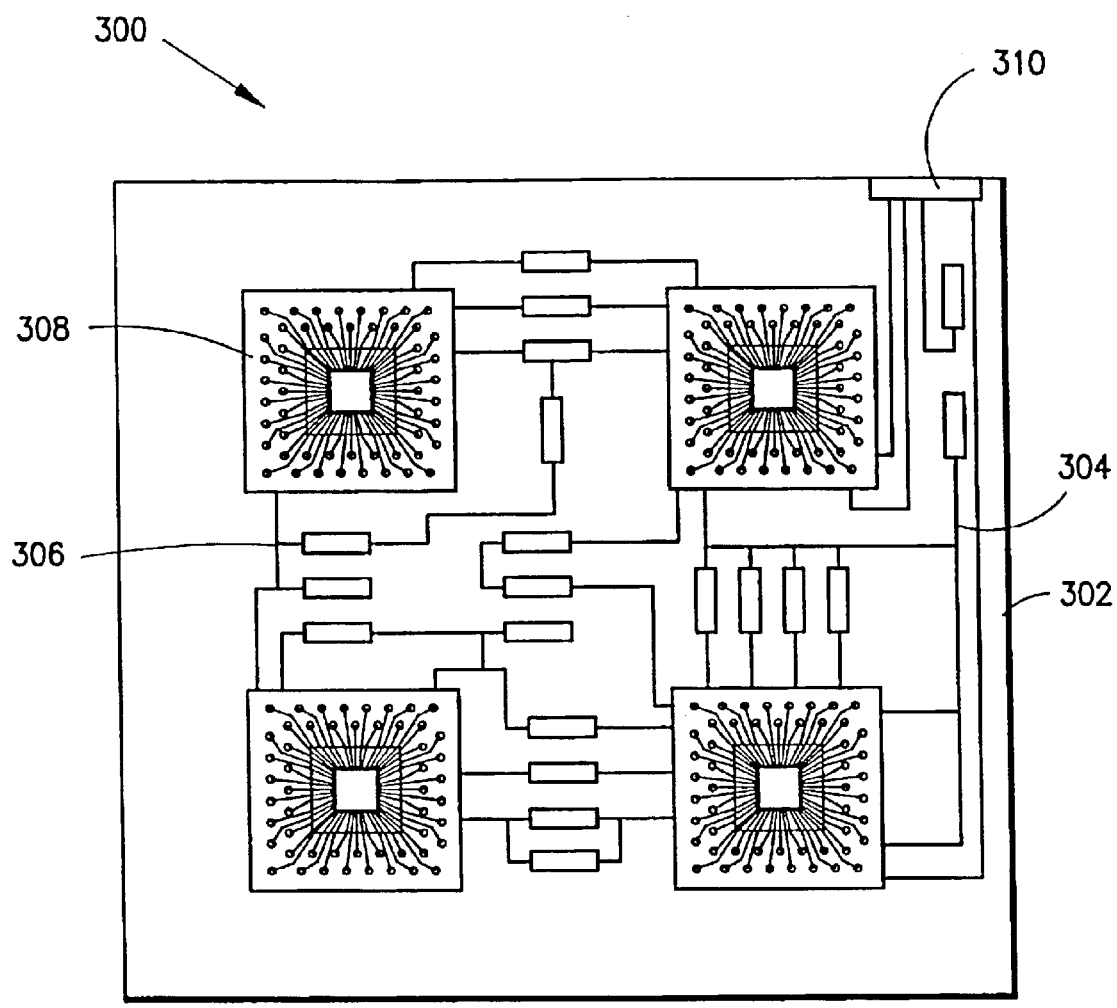
FIG. 4 illustrates a top view of an integrated circuit containing multiple ball grid array packages according to the present invention.

The present invention will be described as set forth in the preferred embodiments illustrated in FIGS. 2–5. Other embodiments may be utilized and structural or logical changes may be made without departing from the scope of the present invention.

A ball grid array (BGA) package according to the present invention is illustrated generally at 100 in FIG. 2 in diagram form. BGA package 100 comprises a substrate 102 having top conductive traces 104 formed on an upper surface of substrate 102. Substrate 102 can be of either a single or multi-layered construction as is commonly known in the art, and typically is formed from an organic epoxy-glass resin based material, such as bismaleimide-triazin (BT) resin or FR-4 board as is commonly known in the art. The thickness of substrate 102 is typically on the order of 0.35 mm. Bottom conductive traces 106 are formed on a lower surface of substrate 102 and are electrically connected to top conductive traces 104 through vias or plated through-holes 108. Vias 108 contain a conductive material such as copper. Top conductive traces 104 terminate with bond posts or pads 110. Bottom conductive traces 106 terminate with ball or terminal pads 112. Top conductive traces 104, bottom conductive traces 106, ball pads 112, and bond posts 110 comprise an electrically conductive material such as copper or copper plated with gold, as is known in the art. Not all top conductive traces 104, bottom conductive traces 106, and vias 108 are shown.

Substrate 102 has an opening or aperture 114, extending from the top surface of substrate 102 to the bottom surface of substrate 102. An upward facing cavity is formed by securing a support base such as thin sheet material 116 to the bottom of substrate 102 to cover aperture 114. Thin sheet material 116 is typically any type of polyimide or metal foil based or backed material, such as copper or aluminum, on the order of approximately 0.025 to 0.1 mm thick and preferably 0.05 mm thick, and must be able to withstand temperatures involved in typical solder reflow processes without degradation. An adhesive may be used to secure the thin sheet material 116 to substrate 102. The adhesive could be a thermoplastic, thermoset, or pressure sensitive type. The dimensions (length and width) of the thin sheet material 116 are greater than the dimensions (length and width) of aperture 114 so as to completely cover aperture 114, but typically less than the dimensions (length and width) of substrate 102.

BGA package 100 further comprises a semiconductor element or die 120 mounted in the cavity formed by the aperture 114 and thin sheet material 116, which minimizes the effect of die thickness on the overall package height. Semiconductor element 120 has a plurality of bonding pads 122 formed on an upper surface. Each of the plurality of bond pads 122 is electrically connected to top conductive traces 104 with a wire bond 124. Typically, a solder mask material (not shown) with openings over the bond posts 110 and ball pads 112 is applied to the outer surfaces of the substrate 102. Typically, semiconductor element 120, wire bonds 124, and a portion of substrate 102 are covered by an encapsulating compound 126, such as epoxy.

Conductive solder balls 128 are each attached to a ball pad 112. Conductive solder balls 128 are later connected to a next level of assembly or printed circuit board 302 (FIG. 4) using a standard reflow process. The number and arrangement of conductive solder balls 128 on the lower surface of substrate 102 depends on circuit requirements including input/output, power and ground connections.

FIG. 3 illustrates a portion of a cross-sectional view of a further embodiment of a BGA package 200 according to the present invention. BGA package 200 comprises a substrate 202 having bottom conductive traces 204 formed on a lower surface of substrate 202. Substrate 202 can be of either a single or multi-layered construction as is commonly known in the art, and typically is formed from an organic epoxy-glass resin based material, such as bismaleimide-triazin (BT) resin or FR-4 board as is commonly known in the art. The thickness of substrate 202 is typically on the order of 0.35 mm. Bottom conductive traces 204 terminate with ball or terminal pads 212. Bottom conductive traces 204 and ball pads 212 comprise an electrically conductive material such as copper or copper plated with gold, as is known in the art. Not all bottom conductive traces 204 are shown.

Substrate 202 has an opening or aperture 214 extending from the top surface of substrate 202 to the bottom surface of substrate 202. A downward facing cavity is formed by securing a support material such as thin sheet material 216 to the top surface of substrate 202 to cover aperture 214. Thin sheet material 216 is typically any type of polyimide or metal foil based or backed material, such as copper or aluminum, on the order of approximately 0.025 to 0.1 mm thick and preferably 0.05 mm thick, and must be able to withstand temperatures involved in typical solder reflow processes without degradation. An adhesive may be used to secure the thin sheet material 216 to substrate 202. The adhesive could be a thermoplastic, thermoset, or pressure sensitive type. The dimensions (length and width) of the thin sheet material 216 are greater than the dimensions (length and width) of aperture 214 so as to completely cover aperture 214, but typically less than the dimensions (length and width) of substrate 202.

BGA package 200 further comprises a semiconductor element or die 220 inverted and mounted in the cavity formed by the aperture 214 and thin sheet material 216, which minimizes the effect of die thickness on the overall package height. Semiconductor element 220 has a plurality of bonding pads 222 formed on its upper surface, which is now facing downwards. Each of the plurality of bond pads 222 is electrically connected to bottom conductive traces 204 with a wire bond 224. Typically, a solder mask material (not shown) with openings over the bond pads 222 and ball pads 212 is applied to the outer surfaces of the substrate 202. Typically, semiconductor element 220, wire bonds 224, and a portion of substrate 202 are covered by an encapsulating compound 226.

Conductive solder balls 228 are each attached to a ball pad 212. Conductive solder balls 228 are later connected to a next level of assembly or printed circuit board 302 (FIG. 4) using a standard reflow process. The number and arrangement of conductive solder balls 228 on the lower surface of substrate 202 depends on circuit requirements including input/output, power and ground connections.

FIG. 4 illustrates an integrated circuit 300, such as a SDRAM or SLDRAM memory module or the like, which utilizes multiple ball grid array packages according to the present invention. Integrated circuit 300 is comprised of printed circuit board 302. Printed circuit board 302 contains a plurality of top conductive traces 304 on the top surface, and may or may not contain conductive traces on the bottom surface or intermediate layers. Mounted on printed circuit board 302 are various electronic components 304, as necessary for operation of the integrated circuit 300, and low profile ball grid array packages 308 as hereinbefore described with reference to FIGS. 2 and 3.

Figure 5:
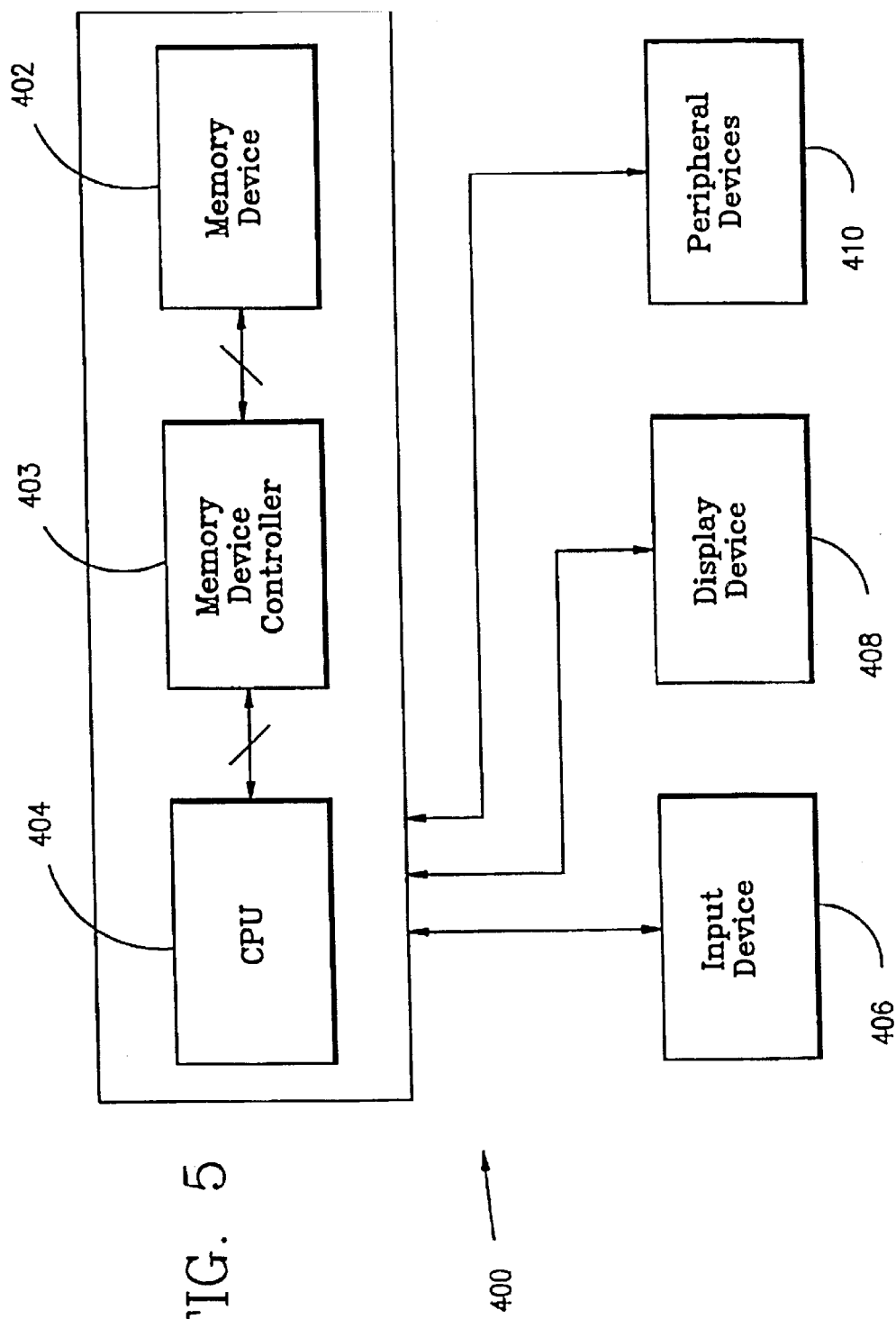
FIG. 5 is a block diagram of a typical processor controlled system in which the present invention would be used.

Printed wiring board 302 is provided with input/output connectors 310 for connection in an end product system (FIG. 5). The use of the low profile ball grid array packages 308 minimizes the overall height of the integrated circuit 300 and allows for smaller end-product packaging.

A typical processor system which includes integrated circuits, such as memory devices, that contain low profile ball grid array packages according to the present invention, is illustrated generally at 400 in FIG. 5 in block diagram form. A computer system is exemplary of a device having integrated circuits such as memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain integrated circuit devices which can utilize the present invention.

A processor system, such as a computer system, generally comprises a memory device 402, such as a SDRAM or SLDRAM memory module, a memory device controller 403, a central processing unit (CPU) 404, input devices 406, display devices 408, and/or peripheral devices 410. It should be noted that a system may or may not include some or all of the aforementioned devices, and may or may not include multiple devices of the same type.

Memory device 402 and CPU 404 include integrated circuits which contain ball grid array packages according to the present invention hereinbefore described with reference to FIGS. 2 and 3. The use of low profile ball grid array packages according to the present invention reduces the size and cost of the integrated circuits, effectively reducing the size and cost of the end product processor system.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed is:

1. A processor system comprising:

a central processing unit; and a memory device connected to said central processing unit, said memory device comprised of a plurality of low profile ball grid array semiconductor packages, said low profile ball grid array semiconductor packages comprised of a base substrate having a top surface and a bottom surface, with an aperture therein which extends from said top surface to said bottom surface, a series of conductive traces located on one of said top surface and said bottom surface of said base substrate, a plurality of conductive balls connected to said series of conductive traces, a thin sheet material secured to said base substrate and covering said aperture such that a cavity is formed, said thin sheet material having a thickness of from approximately 0.025 to 0.1 mm, and a semiconductor element mounted in said cavity.

2. The processor system according to claim 1, said single thin layer of material further comprising:

a polyimide based material.

3. The processor system according to claim 1, said single thin layer of material further comprising:

a metal foil based material.

4. A processor system comprising:

a central processing unit; and a memory device connected to said central processing unit, said memory device comprised of a plurality of low profile ball grid array semiconductor packages, said low profile ball grid array semiconductor packages comprised of a base substrate having a top surface and a bottom surface, said base substrate having an aperture extending from said top surface to said bottom surface, a series of conductive traces located on one of said top surface and said bottom surface of said base substrate, a plurality of conductive balls connected to said series of conductive traces, a thin sheet material secured to said top surface of said base substrate and covering said aperture to form a downward facing cavity, said thin sheet material having a thickness of from approximately 0.025 to 0.1 mm, and a semiconductor element mounted in said downward facing cavity.

5. The processor system according to claim 4, said single thin layer of material further comprising:

a polyimide based material.

6. The processor system according to claim 1, said single thin layer of material further comprising:

a metal foil based material.

7. A processor system comprising:

a central processing unit; and a memory device connected to said central processing unit, said memory device comprised of a plurality of low profile ball grid array semiconductor packages, said low profile ball grid array semiconductor packages comprised of a base substrate having a top surface and a bottom surface, with an aperture therein which extends from said top surface to said bottom surface, a series of conductive traces located on one of said top surface and said bottom surface of said base substrate, a plurality of conductive balls connected to said series of conductive traces, a thin sheet material secured to said base substrate and covering said aperture such that a cavity is formed, said thin sheet material having a thickness of from approximately 0.025 to 0.1 mm, and a semiconductor element mounted in said cavity.

* * * * *